(12) United States Patent
Azuma et al.

(10) Patent No.: US 7,541,716 B2
(45) Date of Patent: Jun. 2, 2009

(54) RESONATOR

(75) Inventors: Tomohisa Azuma, Tokyo (JP);
Masakazu Hirose, Tokyo (JP); Akira Suzuki, Tokyo (JP); Kouji Taniwaki, Tokyo (JP)

(73) Assignee: TDK Corporation, Tokyo (JP)

( * ) Notice: Subject to any disclaimer, the term of this patent is extended or adjusted under 35 U.S.C. 154(b) by 209 days.

(21) Appl. No.: 11/397,952

(22) Filed: Apr. 4, 2006

(65) Prior Publication Data

US 2006/0250050 A1    Nov. 9, 2006

(30) Foreign Application Priority Data

Apr. 8, 2005    (JP)    ............... 2005-111507

(51) Int. Cl.
*H01L 41/047*    (2006.01)
*H01L 41/187*    (2006.01)
(52) U.S. Cl. ............ 310/320; 310/358; 310/365
(58) Field of Classification Search ........ 310/358, 310/359, 320, 324; 252/62.9 R, 62.9 PZ
See application file for complete search history.

(56) References Cited

U.S. PATENT DOCUMENTS

| | | | |
|---|---|---|---|
| 3,699,045 A * | 10/1972 | Tsubouchi et al. | .... 252/62.9 PZ |
| 5,430,345 A | 7/1995 | Takahashi | |
| 6,383,408 B1 * | 5/2002 | Horikawa et al. | ..... 252/62.9 PZ |
| 6,791,241 B1 | 9/2004 | Ikegami | |
| 2001/0022488 A1 | 9/2001 | Kawauchi et al. | |
| 2002/0057039 A1 | 5/2002 | Yoshida | |
| 2003/0134156 A1 * | 7/2003 | Kim et al. | .................. 428/702 |
| 2004/0046481 A1 * | 3/2004 | Takeuchi et al. | ............ 310/311 |
| 2005/0006618 A1 * | 1/2005 | Nanao et al. | ............ 252/62.9 R |
| 2005/0075235 A1 | 4/2005 | Azuma | |

FOREIGN PATENT DOCUMENTS

| | | |
|---|---|---|
| EP | 1 519 427 A2 | 3/2005 |
| JP | 08-237066 | 9/1996 |
| JP | 2001097771 A | 4/2001 |

OTHER PUBLICATIONS

European Search Report for corresponding European application No. 06007382.2-2215 lists the references above.

* cited by examiner

*Primary Examiner*—Quyen P Leung
*Assistant Examiner*—Derek J Rosenau
(74) *Attorney, Agent, or Firm*—Hogan & Hartson LLP

(57) ABSTRACT

There is provided a resonator having a piezoelectric ceramic resonator which has excellent free-fall resistance. The resonator comprises a piezoelectric ceramic resonator 2 with a vibrating electrode formed, and a substrate 3 which supports the piezoelectric ceramic resonator 2, wherein the piezoelectric ceramic resonator 2 satisfies the condition of U≧0.88× H+20.28, wherein U=maximum elastic energy (kJ/m³) per unit volume, and H=drop height (m) (H>1). The present invention can be applied to a resonator 1, wherein the substrate 3 has terminal electrodes 31, 32, and the piezoelectric ceramic resonator 2 is in electrical continuity with the vibrating electrode and is supported on the substrate 3 at both ends via a conductive stator 4.

7 Claims, 5 Drawing Sheets

RESONATOR

BACKGROUND OF THE INVENTION

1. Field of the Invention

The present invention relates to a resonator employing a piezoelectric ceramic resonator, and particularly relates to a resonator having excellent free-fall resistance.

2. Description of the Related Art

Piezoelectric resonating parts (resonators) which employ a piezoelectric ceramic resonator are known as resonators that attain an oscillating frequency. As illustrated in FIG. 1, a piezoelectric ceramic resonator 2 is constituted by forming a pair of vibrating electrodes 22, 23 on the front and back main faces of a polarized piezoelectric ceramic substrate 21, so that vibrations are trapped in the vicinity of the pair of vibrating electrodes 22, 23. As illustrated in FIG. 2, a resonator 1 employing this piezoelectric ceramic resonator 2 comprises a substrate 3 and a cap 5. The substrate 3 has a strengthening function, and for example can be constituted from a ceramic such as steatite ($MgO \cdot SiO_2$), alumina ($Al_2O_3$) or the like. Such a substrate normally has a thickness of about 0.05 to 0.7 mm. Terminal electrodes 31, 32 are formed on the front and back faces of the substrate 3. The substrate 3 can also be constituted using a single-layer dielectric ceramic, a ceramic laminate or the like, so as to combine dielectric function with a strengthening function. Examples of a single-layer dielectric ceramic include compounds having barium titanate as a main component. Examples of a ceramic laminate include low-temperature sintered ceramics having internal electrodes, and can be obtained by, for example, simultaneously sintering $Al_2O_3$ or $CaZrO_3$ to which a glass component has been added with a conductive paste of Cu, Ag or the like, at a temperature of 1,000° C. or less.

The piezoelectric ceramic resonator 2 is adhered and fixed onto the terminal electrodes 31, 32 by a conductive stator 4, such as a conductive resin or solder, which combines the functions of conduction and adherence. A constant vibration space can be secured according to the thickness of the conductive stator 4 in between the piezoelectric ceramic resonator 2 and substrate 3.

The cap 5 is adhered onto the substrate 3 by an adhesive, for example, so as to cover the piezoelectric ceramic resonator 2. Although the cap 5 can be constituted from a ceramic such as steatite ($MgO \cdot SiO_2$), alumina ($Al_2O_3$) or the like as in the case of the substrate 3, it is also acceptable to constitute from an alloy or similar metal. The thickness of the cap 5 can be made about the same as that of the substrate 3.

A resonator 1 such as that described above is disclosed in, for example, Japanese Patent Laid-Open No. 8-237066 (Patent Document 1).

SUMMARY OF THE INVENTION

The piezoelectric ceramic resonator 2 is usually composed of a piezoelectric ceramic composition having a tetragonal or rhombohedral PZT ($PbZrO_3$—$PbTiO_3$ solid solution)-based or PT ($PbTiO_3$)-based perovskite structure at about room temperature, for example. When a piezoelectric ceramic resonator 2 is employed as a resonator 1, not only is a large band $Q_{max}$ ($Q_{max}$=tan θ: wherein θ denotes phase angle) required for its electric properties, but along with the spreading use of surface mount devices in recent years, high heat resisting properties are also demanded because, when parts are mounted on print circuit boards, the boards are passed through a solder reflow furnace. Here, when heat resisting properties are referred to as "high" or "good", this means that the variation in properties after being subjected to thermal shock is small.

The piezoelectric ceramic resonator 2 constituting the resonator 1 is required to possess a high mechanical strength in addition to the properties mentioned above. This is because product specifications require the piezoelectric ceramic resonator 2 to not have any abnormalities such as chips or cracks when the resonator 1 is allowed to free-fall onto concrete from a height of, for example, 1 meter (free-fall resistance). Therefore, since mechanical strength as required by a product specification is not itself a physical property, in the past the guidelines for how free-fall resistance could be improved were unclear. Moreover, while currently the height of fall (hereinbelow, the height of fall will be referred to "drop height") when evaluating free-fall resistance is 1 meter, it is expected that in the future this drop height may be increased in response to demands for greater mechanical strength.

The present invention was created based on such technical problems, wherein it is an object thereof to provide a resonator having excellent free-fall resistance.

The present inventors have confirmed from free-fall drop tests on a resonator in which the drop height was varied that there is a strong correlation between defect ratio and the maximum elastic energy U and drop height of the piezoelectric ceramic resonator. That is, the present invention is a resonator comprising a piezoelectric ceramic resonator having a vibrating electrode, and a substrate which supports the piezoelectric ceramic resonator, wherein the piezoelectric ceramic resonator satisfies a condition that $U \geq 0.88 \times H + 20.28$, wherein U=maximum elastic energy ($kJ/m^3$) per unit volume, and H=drop height (m) (H>1). The maximum elastic energy U per unit volume is obtained by the below formula (1). In the below, with regards to U the words "per unit volume" will be omitted.

$$U = 1/18 \times \sigma_b^2 / E_b \quad (1)$$

wherein $\sigma_b$ is the three point bending strength and $E_b$ is the three point bending modulus of elasticity.

The resonator according to the present invention is particularly effective when the substrate has a structure that comprises a terminal electrode wherein the piezoelectric ceramic resonator is supported at both ends on the substrate and in electrical continuity with the vibrating electrode via a conductive member. Thus, the present invention also encompasses a structure which supports a piezoelectric ceramic resonator on the substrate via some other member.

Further, in the resonator according to the present invention, the piezoelectric ceramic resonator preferably has a perovskite compound represented by Pb, α[$(Mn_{1/3}Nb_{2/3})_x Ti_y Zr_z$]$O_3$ as a main component.

However, in the above composition formula, $0.97 \leq \alpha \leq 1.01$, $0.04 \leq x \leq 0.16$, $0.48 \leq y \leq 0.58$, $0.32 \leq z \leq 0.41$.

According to the present invention, a resonator can be provided which comprises a piezoelectric ceramic resonator having excellent free-fall resistance. Moreover, according to the present invention, if the maximum elastic energy U of the piezoelectric ceramic resonator is understood, a highly reliable resonator can be provided without conducting an actual drop test.

DETAILED DESCRIPTION OF THE PREFERRED EMBODIMENTS

The present invention will now be described in more detail based on the embodiments.

Figure 2:
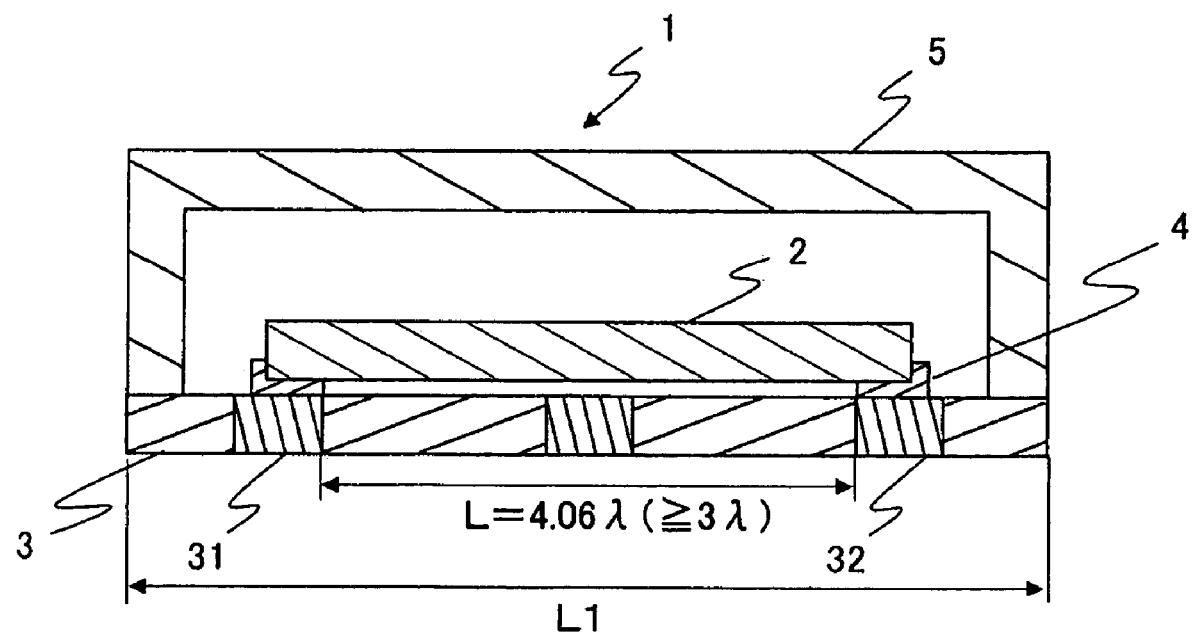
FIG. 2 is a cross-sectional view illustrating the configuration of a resonator.

FIG. 2 is a cross-sectional view for explaining the resonator 1 according to the present embodiment. The basic structure of the resonator 1 illustrated in FIG. 2 has been explained in the section entitled "Description of the Related Art", and thus repetitive explanation will be omitted here.

The present invention is characterized in that the piezoelectric ceramic resonator 2, which is a constituent feature of the resonator 1, satisfies the condition $U \geq 0.88 \times H + 20.28$ wherein U=maximum elastic energy (kJ/m$^3$), and H=drop height (m) (H>1). By satisfying this condition, the occurrence of defects such as chips or cracks in the piezoelectric ceramic resonator 2 can be prevented when the resonator 1 is dropped from a certain height. The drop tests from which this condition was derived will now be explained.

Specimens comprising the following piezoelectric ceramics were subjected to a three point bending test, whereby three point bending strength and three point bending elasticity modulus were measured. The maximum elastic energy U was obtained from these measurement results. The specimens were prepared in the following manner.

As starting raw materials, there were prepared powders of lead oxide (PbO), titanium oxide (TiO$_2$), zirconium oxide (ZrO$_2$), manganese carbonate (MnCO$_3$), niobium oxide (Nb$_2$O$_5$), aluminum oxide (Al$_2$O$_3$), silicon oxide (SiO$_2$), and chromium oxide (Cr$_2$O$_3$). These raw material powders were weighed out to have the molar ratio Pb$_{0.99}$[(Mn$_{1/3}$Nb$_{2/3}$)$_{0.10}$Ti$_{0.53}$Zr$_{0.37}$]O$_3$. The below additives were then added with respect to the total weight of the respective raw material powders. Each mixture underwent wet mixing for 10 hours using a ball mill, whereby 7 types of slurry were prepared.

(1) MnCO$_3$ powder: 0.2 wt %
(2) MnCO$_3$ powder: 0.2 wt %, SiO$_2$ powder: 0.02 wt %
(3) MnCO$_3$ powder: 0.3 wt %, SiO$_2$ powder: 0.1 wt %
(4) Al$_2$O$_3$ powder: 0.5 wt %, SiO$_2$ powder: 0.02 wt %
(5) Al$_2$O$_3$ powder: 0.7 wt %, SiO$_2$ powder: 0.02 wt %
(6) Al$_2$O$_3$ powder: 1.0 wt %, SiO$_2$ powder: 0.02 wt %
(7) Cr$_2$O$_3$ powder: 0.1 wt %, SiO$_2$ powder: 0.02 wt %

These obtained slurries were well dried and each subjected to a press compacting and thereafter to a calcination in air by being held at 800° C. for 2 hours. The calcined bodies were finely pulverized with a ball mill to a mean particle size of 0.7 μm, after which the finely pulverized powders were dried.

The dried, finely pulverized powders were charged with a suitable amount of PVA (polyvinyl alcohol) as a binder to thereby produce granules. About 3 g of these granules were charged into a die having 20 mm long×20 mm wide cavities. A uniaxial press machine was used to perform compacting at a pressure of 245 MPa. The obtained compacted bodies were subjected to a treatment for removing the binder, and then were sintered in air at between 1,150 and 1,250° C. for 2 hours, whereby 7 types of sintered body were obtained. Both surfaces of each of the sintered bodies were flattened to a thickness of 0.5 mm using a lapping machine. The sintered bodies were then cut to 15.0 mm×7.0 mm, after which temporary electrodes for polarization were formed on both ends thereof (in the 7.0 mm direction). The resulting objects underwent a polarizing treatment by applying a 3 kV/mm electric field for 20 minutes in a silicon oil bath having a temperature of 150° C. The polarization direction was made to be a direction parallel to the plate body, and the vibration mode was a thickness-shear mode. The temporary electrodes were subsequently removed. The size of the specimens after the temporary electrodes had been removed was 15 mm×7 mm×0.5 mm. Lapping was again carried out with the lapping machine to a thickness of 0.3 mm and 0.13 mm, and the specimens were cut out into length ×width×thickness of 3.5 mm×0.6 mm×0.3 mm and length ×width×thickness of 3.5 mm×0.6 mm×0.13 mm. The former specimens were for the piezoelectric ceramic resonator, and the latter specimens were for the three point bending tests.

The three point bending tests were carried out in accordance with JIS R1601 using the above-described specimens under the below conditions.

Crosshead speed: 0.10 mm/min

Crosshead radius of curvature/distance between support points=0.077 (crosshead radius of curvature=0.2 mm; distance between support points=2.6 mm)

Next, once a piezoelectric ceramic resonator 2 had been prepared from the above-described specimens and integrated into the resonator 1 illustrated in FIG. 2, a free-fall drop test was conducted onto concrete. Three drop heights H of 1.0 m, 1.5 m and 2.0 m were used, wherein dropping was carried out three times for each height.

Figure 6:
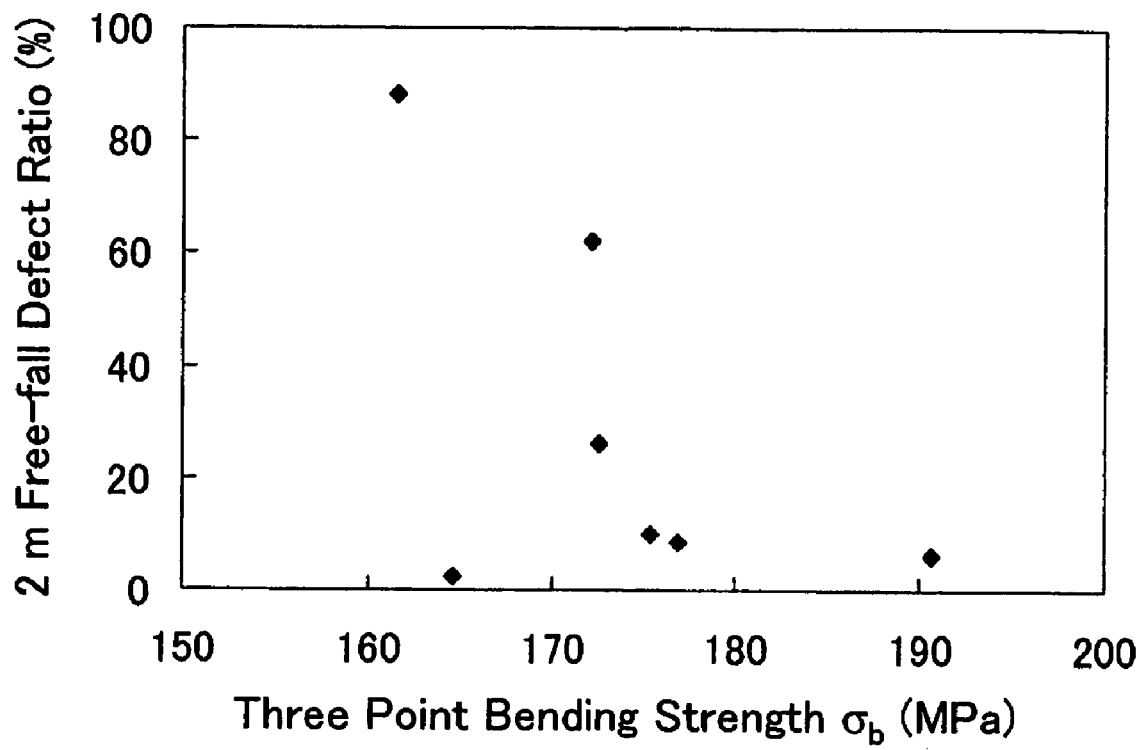
FIG. 6 is a graph illustrating the relationship between three point bending strength $\sigma_b$ and defect ratio in a drop test.
Figure 7:
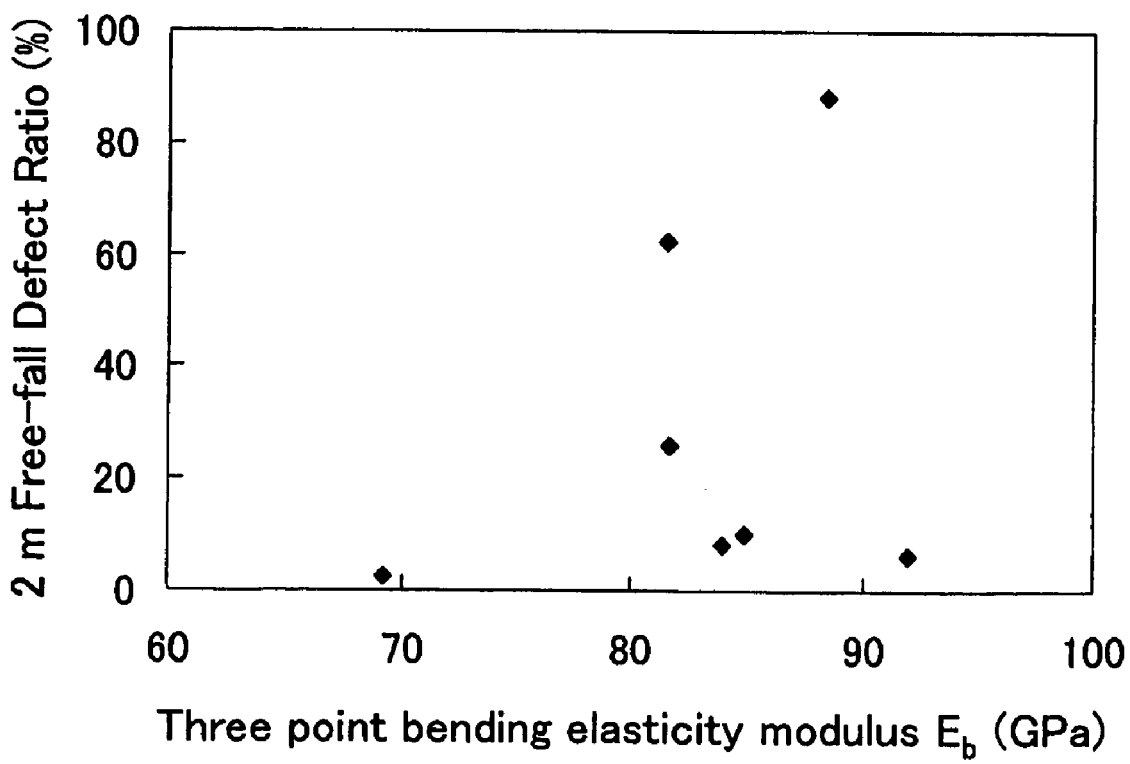
FIG. 7 is a graph illustrating the relationship between three point bending elasticity modulus $E_b$ and defect ratio in a drop test.
Figure 8:
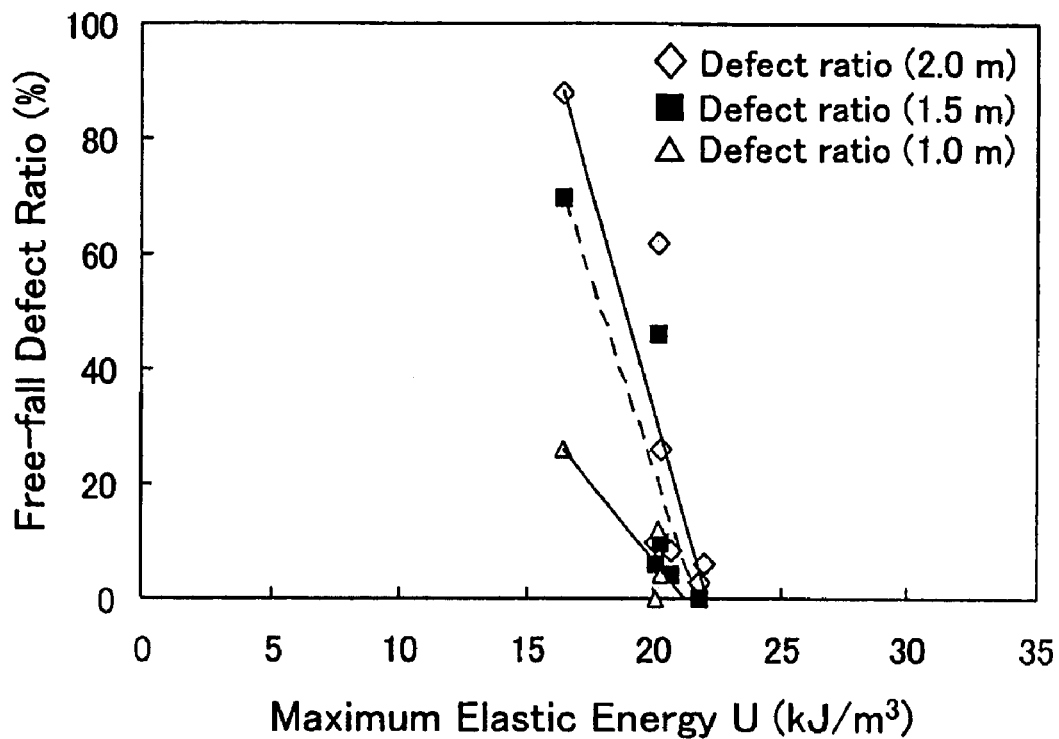
FIG. 8 is a graph illustrating the relationship between maximum elastic energy U and defect ratio in a drop test.

For the drop tests wherein the drop height H was 2.0 m, the relationship between defect ratio and three point bending strength $\sigma_b$, the relationship between defect ratio and three point bending elasticity modulus $E_b$, and the relationship between defect ratio and maximum elastic energy U are shown in FIGS. 6 to 8, respectively. As illustrated in FIG. 6, the correlation between defect ratio and three point bending strength $\sigma_b$ is generally strong, meaning that defect ratio can be lowered by increasing the three point bending strength $\sigma_b$. However, in some cases the defect ratio is low even though the three point bending strength $\sigma_b$ is small. As illustrated in FIG. 7, this is also the case for three point bending elasticity modulus $E_b$. On the other hand, unlike the three point bending strength $\sigma_b$ and three point bending elasticity modulus $E_b$, there are no exceptions for maximum elastic energy U, wherein the correlation with defect ratio holds.

Based on the above-described relationship between defect ratio (%) and maximum elastic energy U, obtaining the maximum elastic energy $U_o$, wherein the defect ratio reaches 0% for the respective drop height H, gave the following.

Figure 9:
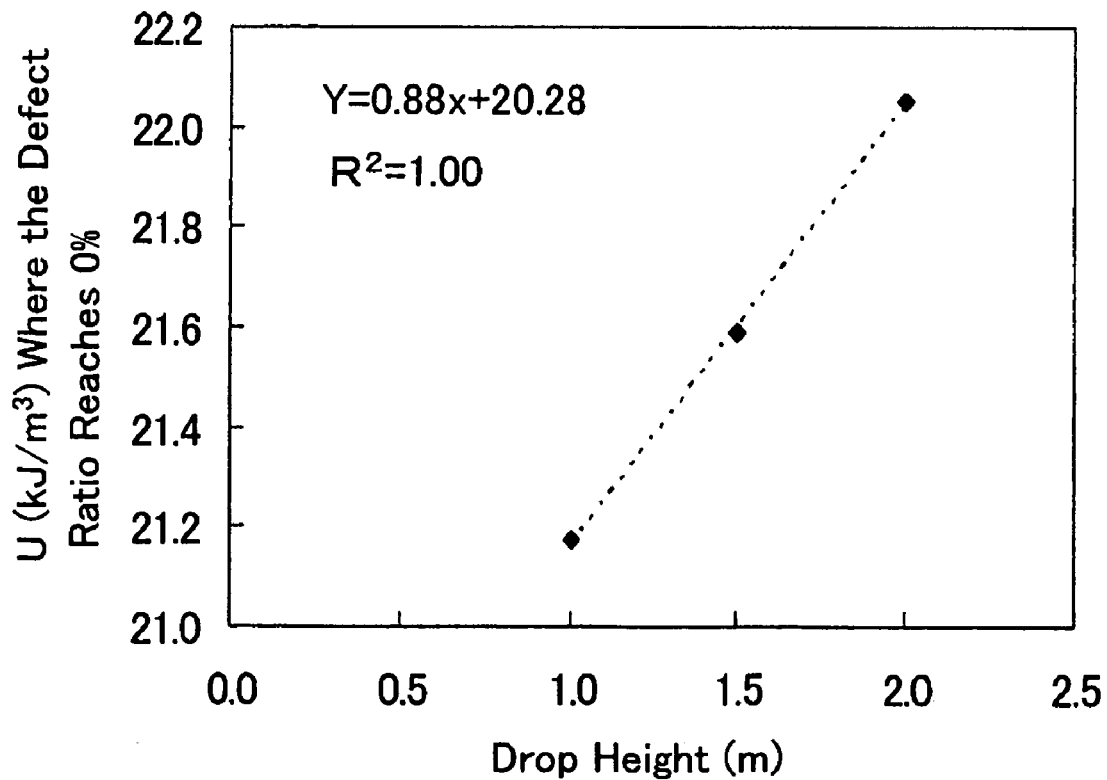
FIG. 9 is a graph illustrating the relationship between drop height H and maximum elastic energy U where the defect ratio reaches 0%.

Drop height 1.0 m: $U_o$=21.2 kJ/m$^3$
Drop height 1.5 m: $U_o$=21.6 kJ/m$^3$
Drop height 2.0 m: $U_o$=22.1 kJ/m$^3$ From the above results it is possible to obtain the relationship between the drop height H and the maximum elastic energy U wherein the defect ratio can reach 0%. As illustrated in FIG. 9, this relationship is $U \geqq 0.88 \times H+20.28$ wherein H=drop height (m), H>1). Thus, the present invention uses a piezoelectric ceramic resonator 2 which satisfies this condition. "R" in FIG. 9 denotes a correlation coefficient, and $R^2$ denotes the square value thereof.

The piezoelectric ceramic resonator 2 preparation procedures from the sintered body were as follows.

Both sides of an above-described sintered body were flattened to a thickness of 0.5 mm using a lapping machine. The sintered body was then cut to 15.0 mm×5.0 mm, and temporary electrodes for polarization were formed on both ends thereof (in the 5.0 mm direction). The resulting object underwent a polarizing treatment by applying a 3 kV/mm electric field for 20 minutes in a silicon oil bath having a temperature of 150° C. The polarization direction was made to be a direction parallel to the plate body, and the vibration mode was a thickness-shear mode. The temporary electrodes were subsequently removed. The size of the specimen after the temporary electrodes had been removed was 15 mm×5.0 mm×0.5 mm. Lapping was again carried out with the lapping machine to a thickness of 0.3 mm. Vibrating electrodes 22, 23 were formed using a vacuum evaporation apparatus. The vibrating electrodes 22, 23 were constituted from a 0.01 μm thick Cr under layer and 2 μm thick Ag. After forming the vibrating electrodes 22, 23, a 3.5 mm×0.6 mm×0.3 mm piezoelectric ceramic resonator 2 was prepared from the above specimen by cutting. Although this piezoelectric ceramic resonator 2 was adhered to the substrate 3 by a conductive stator 4, a vibrating space was secured by the rise in height due to the thickness of the conductive stator 4. This substrate 3 was constituted from steatite, and terminal electrodes 31, 32 were formed at the top and bottom surfaces thereof. The thickness of the substrate 3 was 0.45 mm thick. Next, a cap 5 constituted from steatite was adhered to the substrate 3 so as to protect the piezoelectric ceramic resonator 2. Finally, the end potions were made to have a rough surface by barrel polishing, after which a thin-film electrode was deposited on a side face of the substrate 3 so as to connect the terminal electrodes 31, 32 formed on the top and bottom surfaces of the substrate 3. The dimensions of the final resonator 1 were 4.5 mm×2.0 mm×1.1 mm.

The distance L between supports in the resonator 1 was set to be 4.06 λ. λ is the wavelength of the piezoelectric ceramic resonator 2, wherein for the fundamental wave the relation t=½×λ wherein "t" denotes thickness holds true. When using a third harmonic, t=3/2×λ wherein "t" denotes thickness.

Here, in the case of thickness-shear mode, the distance L between supports is preferably 3 λ or more, and more preferably 3.75 λ or more. This is necessary so that the vibrations trapped in the vicinity of the vibrating electrodes 22, 23 are not suppressed. Further, the upper limit for the distance L between supports is preferably set at 0.5 mm less than the outer form (L1 in FIG. 2) of the resonator 1, which is a necessary condition for securing the adhesion width of the airtight cap 5. Here this distance L between supports refers to the distance in a parallel direction to the polarization direction.

Further, when the polarization direction is a thickness-extentional mode with respect to the main surface, the distance L between supports is still preferably 3 λ or more, and more preferably 3.75 λ or more. In this case the distance L between supports refers to the distance in a longitudinal direction of the piezoelectric ceramic resonator 2.

In the above embodiment a resonator 1 having the configuration as illustrated in FIG. 2 was explained. However, it goes without saying that application of the present invention is not limited to the resonator 1 illustrated in FIG. 2. For example, a resonator 30 having the configuration illustrated in FIG. 3 can also be used. This resonator 30 is provided with a capacitative element 6 in between a substrate 3 and a piezoelectric ceramic resonator 2. It is noted that the elements in FIG. 3 which are the same as those in FIG. 2 have been given the same reference numerals as those in FIG. 2, and explanation thereof is omitted.

Figure 1:
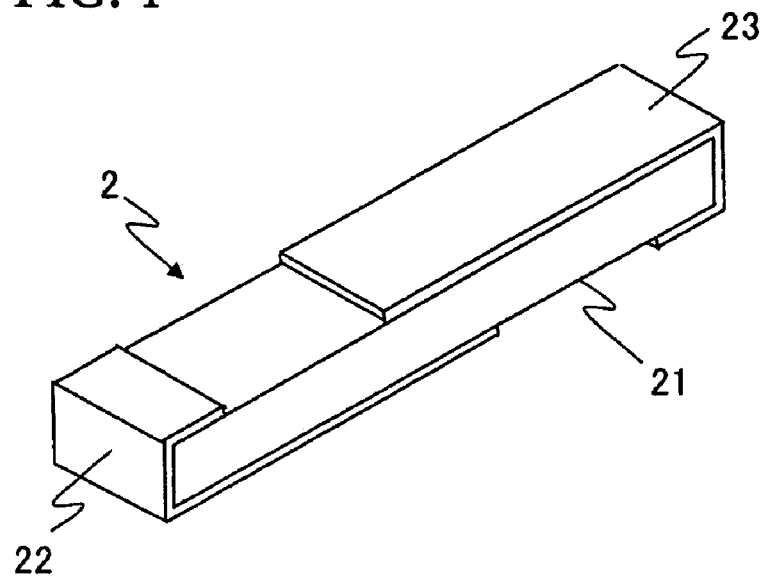
FIG. 1 is a perspective view illustrating the configuration of a piezoelectric ceramic resonator.
Figure 4A:
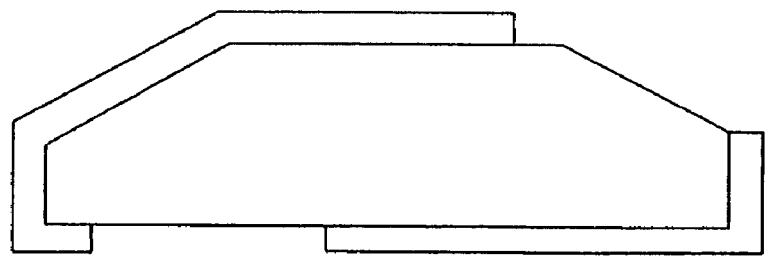
FIGS. 4A and 4B are side views illustrating another configuration of a piezoelectric ceramic resonator.
Figure 4B:
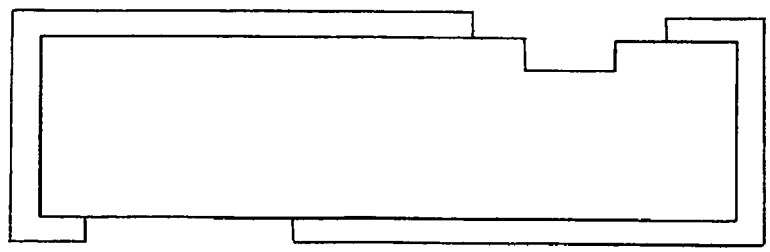

Moreover, the piezoelectric ceramic resonator 2 is not limited to the embodiment illustrated in FIG. 1. Various other embodiments for the piezoelectric ceramic resonator 2 can be used, such as an embodiment having a tapered shape as illustrated in FIG. 4A, or an embodiment into which grooves have been worked as illustrated in FIG. 4B, or the like.

Figure 3:
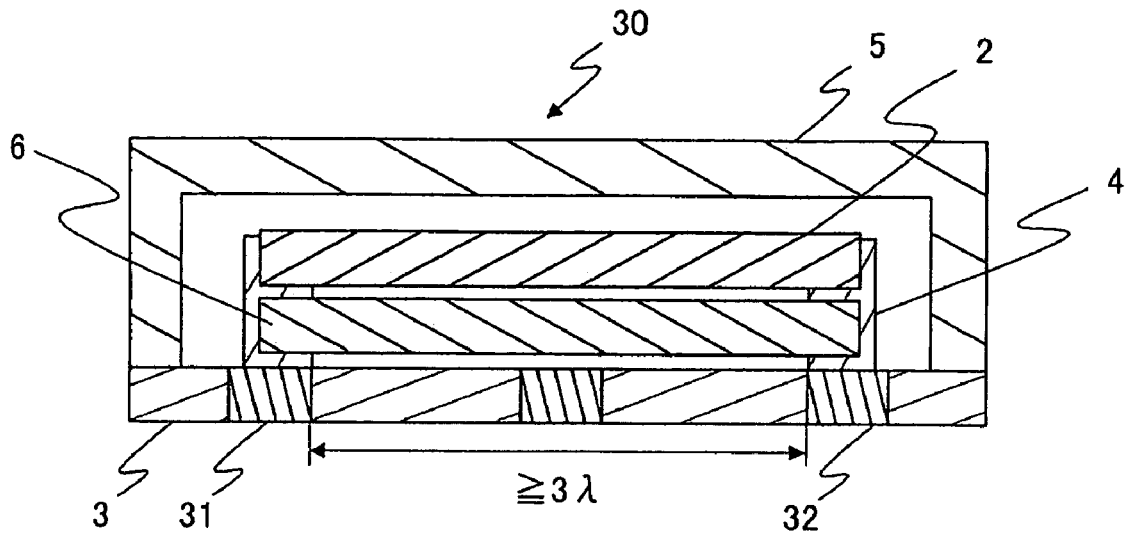
FIG. 3 is a cross-sectional view illustrating another configuration of a resonator.
Figure 5:
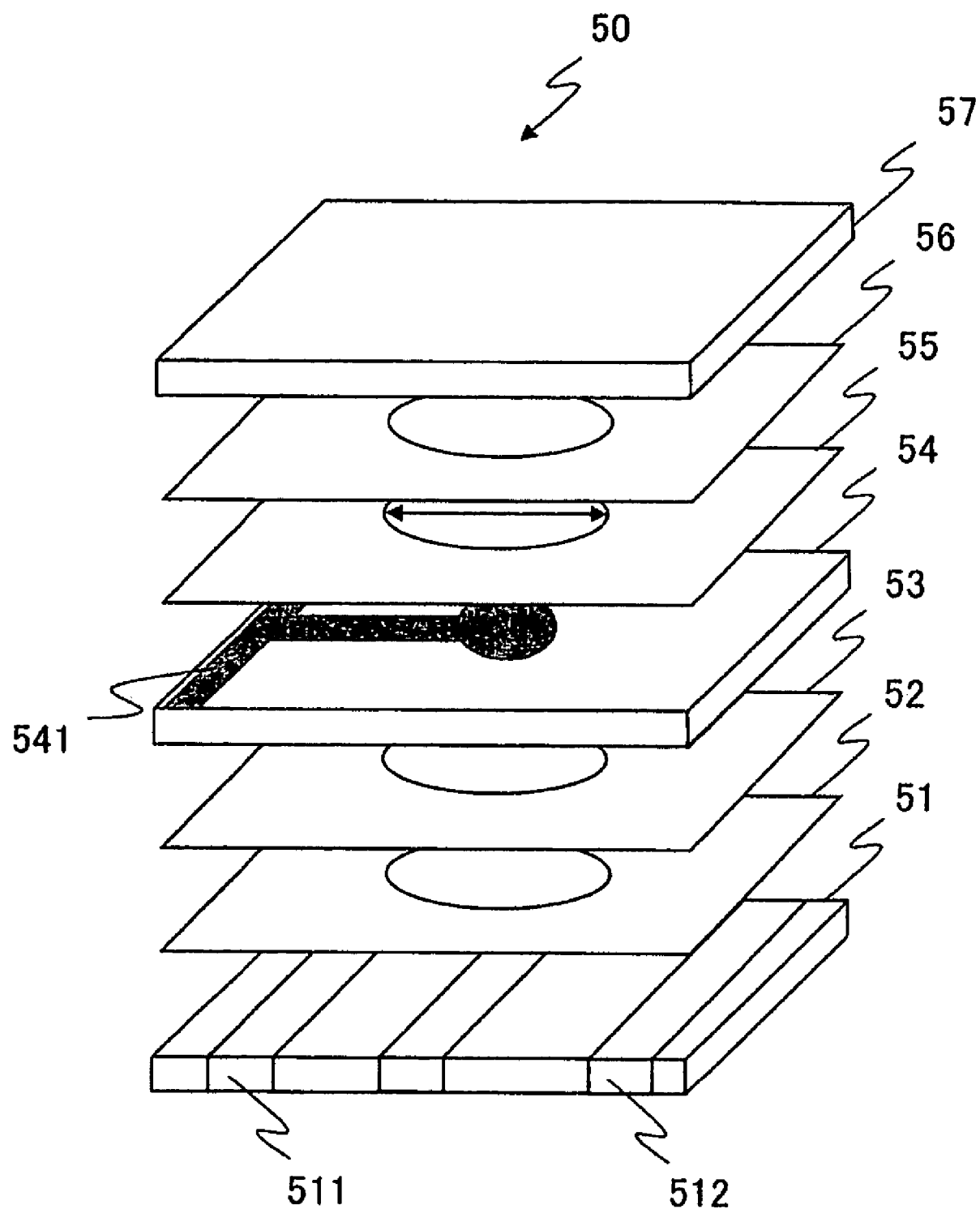
FIG. 5 is a cross-sectional view illustrating another configuration of a resonator.

While FIGS. 2 and 3 show the resonators 1, 30 having an embodiment wherein a piezoelectric ceramic resonator 2 is supported at both ends, application of the present invention is not limited to such an embodiment wherein a piezoelectric ceramic resonator 2 is supported at both ends. For example, the present invention can be applied to a resonator 50 having a configuration illustrated in FIG. 5. This resonator 50 has a structure wherein successively laminated are a substrate 51 provided with terminal electrodes 511 and 512, an adhesion resin layer 52, a hollow resin layer 53, a piezoelectric ceramic resonator 54 provided with a vibrating electrode 541, a hollow resin layer 55, an adhesion resin layer 56, and a cover 57. The distance L between supports in the resonator 50 is indicated by the arrows. The hollow resin layers 53, 55 are provided to secure a vibration space so that the vibrations trapped in the vicinity of the vibrating electrode 541 are not suppressed. So that this space is maintained and to secure its air tightness, a cover 57 is adhered with an adhesion resin layer 56.

As explained above, the present invention is characterized by using a piezoelectric ceramic composition which satisfies the condition $U \geqq 0.88 \times H+20.28$, wherein H=drop height (m), H>1. A preferable piezoelectric ceramic composition and production method thereof will now be explained.

<Piezoelectric Ceramic>

The piezoelectric ceramic used in the present invention, in which the main component is PZT having a perovskite type structure, preferably contains Mn or Nb as this main component. More preferable main components are represented by the following composition formula. It is noted that the term "chemical composition" as used here refers to the composition after sintering.

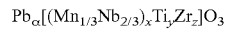

$$Pb_\alpha[(Mn_{1/3}Nb_{2/3})_x Ti_y Zr_z]O_3$$

wherein in the composition formula α, x, y and z fall within the ranges of $0.97 \leqq \alpha \leqq 1.01$, $0.04 \leqq x \leqq 0.16$, $0.48 \leqq y \leqq 0.58$ and $0.32 \leqq z \leqq 0.41$, respectively, and α, x, y and z each represent a molar ratio.

The reasons for imposing limitations on α, x, y and z in the composition formula are as follows.

The quantity α representing the Pb content is preferably limited to fall within the range of $0.97 \leqq \alpha \leqq 1.01$. When α is less than 0.97, it is difficult to obtain a dense sintered body. On the other hand, when α exceeds 1.01, no satisfactory heat resisting properties can be obtained. Accordingly, α is preferably limited to fall within the range of $0.97 \leqq \alpha \leqq 1.01$, more preferably $0.98 \leqq \alpha < 1.00$, and furthermore preferably $0.99 \leqq \alpha < 1.00$.

The quantity x representing the Mn content and the Nb content is preferably limited to fall within the range of $0.04 \leqq x \leqq 0.16$. When x is less than 0.04; $Q_{max}$ becomes small. On the other hand, when x exceeds 0.16, no satisfactory heat resisting properties can be obtained. Accordingly, x is preferably limited to fall within the range of $0.04 \leq x \leq 0.16$, more preferably $0.06 \leq x \leq 0.14$, and furthermore preferably $0.07 \leq x \leq 0.11$.

The quantity y representing the Ti content is limited to fall within the range of $0.48 \leq y \leq 0.58$. When y is less than 0.48, no satisfactory heat resisting properties can be obtained. On the other hand, when y exceeds 0.58, no satisfactory temperature characteristics can be obtained. Accordingly, y is preferably limited to fall within the range of $0.48 \leq y \leq 0.58$, more preferably $0.49 \leq y \leq 0.57$, and furthermore preferably $0.50 \leq y \leq 0.55$.

The quantity z representing the Zr content is limited to fall within the range of $0.32 \leq z \leq 0.41$. When z is less than 0.32 or exceeds 0.41, no satisfactory temperature characteristics can be obtained. Accordingly, z is preferably limited to fall within the range of $0.32 \leq z \leq 0.41$, more preferably $0.33 \leq z \leq 0.40$, and furthermore preferably $0.34 \leq z \leq 0.39$. It is noted that the expression "temperature properties are good" refers to a small variation in piezoelectric ceramic properties as a consequence of temperature variation in an operating environment.

For the piezoelectric ceramic used in the present invention, one or more of $Al_2O_3$, $SiO_2$, $MnCO_3$ and $Cr_2O_3$ can be incorporated as additives into the main component.

$Al_2O_3$ and $SiO_2$ are effective in improving the mechanical strength of the piezoelectric ceramic. For $Al_2O_3$, it is preferable to add 0.15 wt % or more with respect to the main component, especially $Pb_\alpha[(Mn_{1/3}Nb_{2/3})_x Ti_y Zr_z]O_3$, and adding 0.6 wt % or more is more preferable. If the added amount of $Al_2O_3$ is too great, piezoelectric properties deteriorate, so that it is thus preferable to add 15.0 wt % or less with respect to the main component. More preferable is 5.0 wt % or less, and even more preferable is 1.5 wt % or less. Further, the added amount of $SiO_2$ is preferably 0.005 to 0.15 wt % with respect to the main component, especially $Pb_\alpha[(Mn_{1/3}Nb_{2/3})_x Ti_y Zr_z]O_3$. A more preferable added amount of $SiO_2$ is from 0.01 to 0.12 wt %, and an even more preferable added amount of $SiO_2$ is from 0.01 to 0.07 wt %.

$MnCO_3$ is effective in improving sintering properties. When incorporating $MnCO_3$ as an additive, a preferable $MnCO_3$ added amount is 0.65 wt % or less with respect to the main component, especially $Pb_\alpha[(Mn_{1/3}Nb_{2/3})_x Ti_y Zr_z]O_3$, and a more preferable $MnCO_3$ added amount is 0.50 wt % or less. An even more preferable $MnCO_3$ added amount is from 0.01 to 0.40 wt %, and a much more preferable $MnCO_3$ added amount is from 0.05 to 0.3 wt %.

$Cr_2O_3$ is effective in attaining satisfactory heat resisting properties. A preferable $Cr_2O_3$ added amount is 0.65 wt % or less with respect to the main component, especially $Pb_\alpha[(Mn_{1/3}Nb_{2/3})_x Ti_y Zr_z]O_3$, and a more preferable $Cr_2O_3$ added amount is 0.50 wt % or less. An even more preferable $Cr_2O_3$ added amount is from 0.01 to 0.30 wt %, and a much more preferable $Cr_2O_3$ added amount is from 0.01 to 0.10 wt %.

It is noted that the above additives were merely cited as one preferable example, and the use of other additives is not excluded.

<Production Method>

Next, a preferable production method of the piezoelectric ceramic used in the present invention will be described below by following the relevant steps in order.

(Raw Material Powders and Weighing Out Thereof)

As the raw materials for the main components, there may be used powders of oxides or powders of compounds to be converted to oxides when heated. More specifically, powders of $PbO$, $TiO_2$, $ZrO_2$, $MnCO_3$, $Nb_2O_5$ and the like can be used. The raw material powders were each weighed out so as to match the composition which is to be ultimately obtained. The foregoing is not limited to these raw material powders, and the powder of a complex oxide comprising two kinds or more of a metal may also be used as the raw material powders.

Then, in relation to the total weight of these weighed powders, predetermined amounts of additives are added. The mean particle size of each of the raw material powders may be appropriately set somewhere within the range of 0.1 to 3.0 µm.

(Calcination)

The raw material powders are subjected to wet mixing and then calcinated while being maintained at a temperature ranging from 700 to 950° C. for a predetermined period of time. This calcination may be conducted under the atmosphere of $N_2$ or air. The calcination time may be appropriately set within the range from 0.5 to 5 hours.

It has been described above that the raw material powders of the main components and the raw material powders of the additives are mixed together, and then both of them are subjected to calcination. However, the timing for adding the raw material powders of the additives is not limited to the above described timing. As an alternative example, firstly the powders of the main components may be weighed out, mixed, calcined and pulverized; and then, to the main component powder thus obtained after calcination and pulverization, the raw material powders of the additives may be added in respective predetermined amounts to make a mixture.

(Granulation and Compacting)

The pulverized powder is granulated for the purpose of smoothly carrying out a subsequent compacting step. At this time, a small amount of an appropriate binder, for example polyvinyl alcohol (PVA) is added to the pulverized powder, and they are fully mixed, and then a granulated powder is obtained by passing the mixed powder through a mesh, for example, for the purpose of sizing the powder particles. Then, the resulting granulated powder is compacted by pressing under a pressure of 200 to 300 MPa to obtain a compacted body having a desired shape.

(Sintering)

After the binder, added at the time of compacting, has been removed from the compacted body, the compacted body is heated and maintained at a temperature within the range from 1100 to 1250° C. for a predetermined period of time to obtain a sintered body. In this sintering, the atmosphere may be $N_2$ or air, and the compacted body may be heated and maintained appropriately within a range from 0.5 to 4 hours.

(Polarization)

After electrodes for the polarization have been formed on the sintered body, the polarization is carried out. The polarization is conducted under the conditions such that the polarization temperature falls within the range from 50 to 300° C., and an electric field of 1.0 to 2.0 Ec (Ec being the coercive field) is applied to the sintered body for 0.5 to 30 minutes.

When the polarization temperature is lower than 50° C., the Ec is elevated and accordingly the voltage for polarization becomes so high that the polarization is difficult to occur. On the other hand, when the polarization temperature exceeds 300° C., the insulation property of the insulating oil is lowered so markedly that the polarization is difficult to occur. Consequently, the polarization temperature is set to fall within a range from 50 to 300° C. The polarization temperature is preferably 60 to 250° C., and more preferably 80 to 200° C.

When the applied electric field is lower than 1.0 Ec, the polarization does not proceed. On the other hand, when the applied electric field is higher than 2.0 Ec, the actual voltage becomes high, so that the breakdown of sintered body tends to occur and accordingly it becomes difficult to prepare a piezoelectric ceramic. Accordingly, the electric filed to be applied in the polarization is set to be 1.0 to 2.0 Ec. The applied electric field is preferably 1.1 to 1.8 Ec, and more preferably 1.2 to 1.6 Ec.

When the polarization time is less than 0.5 minute, the polarization is not progressed to a sufficient extent, so that the properties cannot be attained to a sufficient extent. On the other hand, when the polarization time exceeds 30 minutes, the time required for the polarization becomes long, so that the production efficiency is degraded. Accordingly, the polarization time is set to be 0.5 to 30 minutes. The polarization time is preferably 0.7 to 20 minutes, and more preferably 0.9 to 15 minutes.

The polarization is conducted in a bath of an insulating oil such as a silicon oil heated to the above described temperature. Incidentally, the polarization direction is determined according to the desired vibration mode. Namely, in the case of thickness-shear mode, polarization can be carried out in a direction parallel to the main surface, while in thickness-extentional mode polarization can be carried out in a direction perpendicular to the main surface.

The piezoelectric ceramic is lapped to a desired thickness, and thereafter vibrating electrodes are formed. Then, using a dicing saw or the like, the piezoelectric ceramic composition is cut into a desired shape so as to function as a piezoelectric ceramic resonator.

What is claimed is:

1. A resonator comprising:

a piezoelectric ceramic resonator with a vibrating electrode formed; and a substrate which supports the piezoelectric ceramic resonator, wherein the substrate comprises terminal electrodes, and the piezoelectric ceramic resonator is supported on the substrate by the terminal electrodes at both ends and is in electrical continuity with the vibrating electrode via a conductive member, and wherein the piezoelectric ceramic resonator satisfies a condition of $U>0.88\times H+20.28$, wherein U=maximum elastic energy ($kJ/m^3$) per unit volume, and H=drop height (m) (H>1), and the piezoelectric ceramic resonator comprises a perovskite compound represented by $Pb\alpha[(Mn_{1/3}Nb_{2/3})_x Ti_y Zr_z]O_3$ as a main component, wherein in the composition formula, $0.97 \leq \alpha \leq 1.01$, $0.04 \leq x \leq 0.16$, $0.48 \leq y \leq 0.58$, and $0.32 \leq z \leq 0.41$, and as additives, Al in a content of 5.0 wt % or less in terms of $Al_2O_3$ and/or Si in a content of 0.1 to 0.15 wt % in terms of $SiO_2$, and a distance L between the terminal electrodes in the resonator is $4.06\lambda$, where $\lambda$ is the wavelength of the piezoelectric ceramic resonator.

2. The resonator according to claim 1, wherein $\alpha$ falls within the range: $0.98 \leq \alpha < 1.00$.

3. The resonator according to claim 1 wherein x falls within the range: $0.06 \leq x \leq 0.14$.

4. The resonator according to claim 1, wherein y fails within the range: $0.49 \leq y \leq 0.57$.

5. The resonator according to claim 1, wherein z falls within the range: $0.33 \leq z \leq 0.40$.

6. The resonator according to claim 1, wherein the piezoelectric ceramic resonator comprises, as an additive, Mn in a content of 0.65 wt % or less in terms of $MnCO_3$.

7. The resonator according to claim 1, wherein the piezoelectric ceramic resonator comprises, as an additive, Cr in a content of 0.65 wt % or less in terms of $Cr_2O_3$.

* * * * *